United States Patent [19]
Lucas et al.

[11] Patent Number: 5,928,375
[45] Date of Patent: Jul. 27, 1999

[54] METHOD FOR ENHANCING DATA TRANSMISSION IN PARITY BASED DATA PROCESSING SYSTEMS

[75] Inventors: Gregg Steven Lucas; Juan Antonio Yanes, both of Tucson, Ariz.

[73] Assignee: International Business Machines Corporation, Armonk, N.Y.

[21] Appl. No.: 08/780,570

[22] Filed: Jan. 8, 1997

[51] Int. Cl.[6] .......................... G06F 11/10; H03M 13/00
[52] U.S. Cl. .................. 714/752; 714/712; 714/798; 714/799
[58] Field of Search .................. 371/37.1, 20.1, 371/47.1, 48; 714/752, 712, 798, 799, 701

[56] References Cited

U.S. PATENT DOCUMENTS

| | | | |
|---|---|---|---|
| 5,155,735 | 10/1992 | Nash et al. | 371/49.1 |
| 5,257,391 | 10/1993 | DuLac et al. | 395/800 |
| 5,461,701 | 10/1995 | Voth | 395/101 |

*Primary Examiner*—Phung My Chung
*Attorney, Agent, or Firm*—Robert M. Sullivan

[57] ABSTRACT

A data transfer system providing parity uses a method and apparatus for transmitting a data clocking signal in a parity bit location along a data bus to latch an accompanying data byte at a receiving device. A transmitting device, coupled to the receiving device through the data bus, generates a data clock signal and latches the clock signal into the parity bit location of the data bus. The clock signal and data byte are then transmitted along the data bus to the receiving device. The receiving device uses the clock signal to latch the data byte from the data bus. Thus, the data transfer system uses the data clock signal transmitted in the parity bit location of the data bus to validate and synchronize the accompanying data byte at the receiving device.

15 Claims, 4 Drawing Sheets

METHOD FOR ENHANCING DATA TRANSMISSION IN PARITY BASED DATA PROCESSING SYSTEMS

FIELD OF THE INVENTION

The present invention relates generally to the transmission of data within data processing systems, and more particularly, to an improved method and apparatus for transmitting data in systems which use a parity bit for error detection.

BACKGROUND OF THE INVENTION

Data processing systems typically contain a central processing unit, or processor, to manage the movement of information, or data, between different peripheral devices coupled to the processor. To manage the movement of data, data processing systems typically accept requests for data from user-controlled input devices, access data from data storage devices, modify data within a central processing unit, and store data back to data storage devices. Data processing systems can vary in size and scope, from small systems totally contained within the one or more circuit boards to large systems transferring large blocks of data between numerous devices separated by great distances. In turn, the central processing unit can vary in size and scope from small microprocessors to large host processing units.

The central processing unit, or processor, within the data processing system typically serves as the central, controlling means for managing the system. The processor controls the surrounding components, circuits, memories, and/or devices. The processor receives signals and information from the peripherals, makes decisions based on this information, and takes actions based on these decisions. In some instances, the actions taken by the processor involve providing responses to the peripheral devices.

Information is transferred between the processor and the peripheral devices by typically sending data through transmission lines, which interconnect the processor and the peripheral devices. Information consists of communication signals and/or data bytes and may be transferred bi-directionally, in either direction, over the transmission lines. Synchronization signals, or clocking signals, often accompany the communication signals and/or data bytes sent from the transmitting device to the receiving device. These synchronization, or clocking, signals coordinate the timing of the transmitted information between the transmitting and receiving device and validate the data on the transmission lines. These signals notify the receiving device that the signal line or data bus contains valid information and cause the receiving device to latch the information on the signal line or data bus.

The clock signals must be synchronized, in time, with the data when transferred from the transmitting device to the receiving device. That is, the validating edge of the clock pulse must properly align with an interval in time in which the data bus contains valid data. This timing synchronization is straight-forward at the transmitting device. Circuitry at the transmitting device can be designed to properly align the clock signal and the valid data. However, aligning the clock signal and the valid data at the receiving device is a more difficult problem. Transmission delays may skew the clock signal relative to the data byte. Current clocking techniques use a clock pulse which is narrower in time than the time period for valid data to overcome the time skew incurred during data transmission. The clock signal is commonly one-half the time interval for valid data.

Other factors increase the time skew problem at the receiving device: using a single clock signal for the transfer of multiple data bytes, lengthening the distance between the transmitting and receiving devices, and increasing the speed of data transmission. If the time skew between the clock signal and the data becomes too large at the receiving device, the clock pulse attempts to validate the data bus at a point where the data is an invalid value, or where the data corresponds to an incorrect byte in the transfer sequence.

Current techniques for transferring data from a transmitting to a receiving device use a single clock signal to synchronize multiple data bytes. Using a single clock pulse compounds the time skew problem. Typically, the second data byte will be skewed differently in time at the receiving device than the first data byte or the clock signal. Narrowing the clock pulse can only partially resolve this increased time skew problem at the receiving device. In turn, shorter clock pulses require a higher frequency, or faster, clock signal for the same data rate. Efficient data transfer systems minimize the difference in clock frequency and data rate.

Current data transfer systems also require the data to be transmitted over longer distances between the transmitting and receiving devices. Longer transmission distances increase the time skew between the data and the clocking signal at the receiving device. As stated earlier, increased time skew creates data validity problems at the receiving device. The validating edge of the clock pulse may align with a point on the data bus where the data is either invalid or the wrong data byte in the transfer sequence. Furthermore, efficient data transfer systems require a higher data rate, which requires a faster clock signal. Increasing the clock speed reduces the width of the clock pulse. A smaller clock pulse combined with a larger time skew compounds the problem of data validity at the receiving device.

Data transfer systems often use a parity bit to detect data errors occurring when the data is transmitted between the transmitting and receiving devices. One ordinarily skilled in the art understands that the parity bit is an effective technique for detecting data transmission errors and is commonly used in data transfer systems. The transmitting device typically generates a parity bit specific to each data byte transmitted and separately latches the parity bit onto the data bus. The parity bit accompanies the data byte from the transmitting device to the receiving device and is latched onto the data bus of the receiving device by the clock signal. In turn, the receiving device uses the same technique to check the parity of each data byte received and compares this expected parity to the actual parity of the received data byte. If the parity values are not equal, a parity error is flagged, denoting an error occurred during the transmission of the data.

Accordingly, a method and system is needed to provide an improved clock signal that validates data at the receiving device such that time skew between the data and the clock signal during data transmission is minimized. The present invention uses a parity bit location within a data bus to transmit a clock signal between a transmitting device and a receiving device. Using the parity bit to send the clock signal minimizes the time skew between the clock signal and the data occurring during data transmission, provides higher data transfer rates, and allows longer distances between the transmitting and receiving devices. The present invention also uses an alternate means for detecting data transmission errors since the parity bit is no longer used to detect these errors.

SUMMARY OF THE INVENTION

An object of the present invention is to provide an improved method and apparatus for synchronizing data, transferred from a transmitting device to a receiving device, by using a parity bit location along a data bus to transmit a data clock signal.

A first embodiment of the present invention provides an improved method for synchronizing data transmitted between a transmitting device and a receiving device. The method first generates a clock signal at the transmitting device. The clock signal is then latched into a parity location within a data bus connecting the transmitting device to the receiving device. The clock signal and data byte are then transmitted along the data bus to the receiving device. The receiving device receives the clock signal and the data byte and uses the clock signal to latch the accompanying data byte from the data bus. The method repeats this sequence for each data byte in the data stream. At the end of the data stream, the method generates error detection codes and transfers these as data bytes from the transmitting device to the receiving device. The receiving device then uses these error detection codes to determine if any errors occurred during the transfer of the data stream from the transmitting device to the receiving device.

Another embodiment of the present invention provides an improved data transfer system for synchronizing data transmitted between a transmitting device and a receiving device. The system includes a data bus coupled between the transmitting and receiving devices. The data bus includes a location for transferring a parity bit with the data. A clock signal, generated at the transmitting device, is latched into the parity bit location within the data bus. The clock signal and data byte are then transmitted along the data bus to the receiving device. The receiving device includes logic to latch the data, using the clock signal transmitted in the parity bit location of the data bus. The transmitted clock signal is coupled to the clock of the latching logic, while the data bit locations within the data bus are coupled to data ports in the latching logic. Thus, the clock signal validates the accompanying data bits at the receiving device. The transmitting and receiving devices further includes logic to generate error detection codes. The receiving device also contains a comparator to verify that the error detection codes calculated at the receiving device match the codes transferred from the transmitting device.

The present invention provides an improved system and technique for transmitting a clock signal and data between a transmitting and a receiving device where the clock signal validates the data at the receiving device. The present invention uses a parity bit location within a data bus to send the clock signal between the transmitting and receiving devices. Using a parity bit location within a data bus to send the clock signal minimizes the time skew between the clock signal and the data occurring during data transmission, provides higher data transfer rates, and allows longer distances between the transmitting and receiving devices.

The foregoing and other objects, features, and advantages of the invention will be apparent from the following more particular description of a preferred embodiment of the invention, as illustrated in the accompanying drawings.

DETAILED DESCRIPTION OF THE INVENTION

Figure 1:
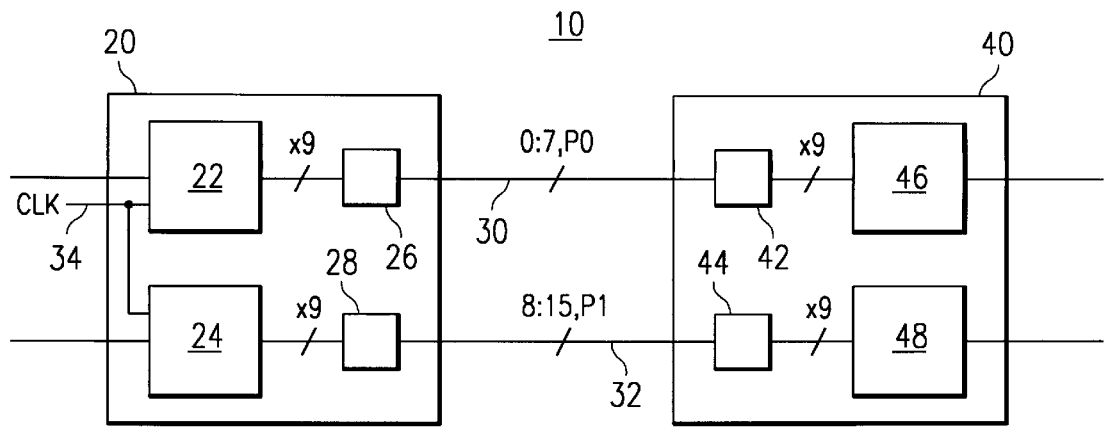
FIG. 1 is a block diagram of a data transfer system using various features embodied in the present invention.

Referring more particularly to the drawing, like numerals denote like features and structural elements in the various figures. The invention will be described as embodied in a typical data transfer system. Turning to FIG. 1, a data transfer system 10 is shown consisting of a transmitting device 20 and a receiving device 40. Two data buses 30, 32 couple the transmitting 20 and receiving 40 devices. A first data bus 30 transfers a first data byte, data bits 0–7, and a first parity bit P0. A second data bus 32 transfers a second data byte, data bits 8–15, and a second parity bit P1. The transmitting device 20 includes a common clock signal 34, data transfer logic 22, 24 for latching each data byte in the data chain, and transceivers 26, 28 for interfacing each latched data byte in the data chain to the data bus 30, 32. The receiving device 40 also includes transceivers 42, 44 for interfacing each data byte in the data chain from the data bus 30, 32 and data transfer logic 46, 48 for latching the data bytes.

A typical data transfer system also requires a signal to synchronize the latching of a data byte onto or off from the data bus. Typical data transfer systems use a clock signal for such purpose. Thus, these typical data transfer systems require an additional signal line between the transmitting 20 and receiving 40 devices to send the clock signal. However, the data transfer system 10 embodied in FIG. 1 does not require an additional signal line between the transmitting 20 and receiving 40 devices since the clock signal 34 is transmitted along the data bus 30, 32 using the parity bit location. In the transmitting device 20, the common clock signal 34 is coupled to the data transfer logic 22, 24 corresponding to each data bus 30, 32. The data transfer logic 22, 24 latches a data byte onto the data bus 30, 32 and a clock signal onto the parity bit location of the data bus 30, 32. Each data byte and clock signal are then transferred along the data bus 30, 32 to the receiving device 40. At the receiving device 40, the data transfer logic 46, 48 uses the corresponding clock signal in the parity bit location to validate and latch each data byte from the data bus 30, 32.

Figure 2A:
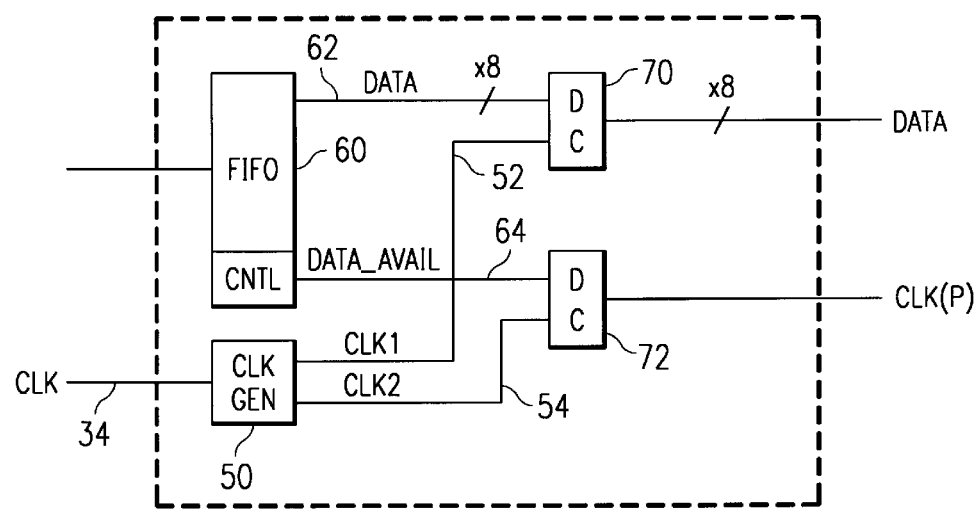
FIG. 2A is a block diagram of data transfer logic contained within the transmitting device shown in the data transfer system of FIG. 1.

Referring to FIG. 2A, a block diagram is shown describing the data transfer logic 22, 24 at the transmitting device 20. A memory buffer (FIFO) 60 contains the data chain to be transferred to the receiving device 40. The memory buffer 60 includes at least two outputs: a FIFO data bus 62 containing the data byte to be transferred to the receiving device 40, and a control signal 64 indicating when the memory buffer has placed valid data on the FIFO data bus 62. The FIFO data bus 62 couples the output of the memory buffer 60 to a data input of an eight bit data latch 70. The data available control signal 64 is coupled to a data input of a single bit parity latch 72.

The data transfer logic 22, 24 also includes a clock generator 50. A clock generator converts the common clock signal 34 within the transmitting device 20 to two output clock signals 52, 54. A first clock signal 52 provides the same frequency as the common clock signal 34 and connects to the clock input of the eight bit data latch 70. A second clock signal 54 operates at twice the frequency of the common clock signal 34 and connects to the clock input of the single bit parity latch 72. The common clock signal 34 serves as a common clock input for the data transfer logic 22, 24 of each data bus 30, 32 and provides synchronization between the separate data buses 30, 32.

The eight bit data latch 70 includes an eight bit output which connects to the input of the transceiver 26, 28 at the transmitting device 20. Additionally, the single bit parity latch 72 output connects to the input of the transceiver 26, 28. Ordinarily, a parity bit is generated in the FIFO memory buffer 60, latched into the single bit parity latch 72, and transferred through the transceiver 26, 28 onto the data bus 30, 32. However, the present invention uses the parity bit location within the data bus 30, 32 to transmit a clock signal used to validate and synchronize the data at the receiving device 40. The clock generator generates two clock signals 52, 54, synchronized to the common clock, within the transmitting device 20. The first clock signal 52 clocks the data byte from the FIFO data bus 62 into the eight bit data latch 70. The second clock signal 54, operating at twice the frequency of the common clock 34, converts the data available control signal 64 from the FIFO memory buffer 60 into a data clocking signal to be transferred to the receiving device 40 in the parity bit location of the data bus 30.

One ordinarily skilled in the art recognizes that two separate clock signals 52, 54 need not be used in the data transfer logic 22, 24. Another embodiment, not shown, could use one clock signal. In this configuration, the data byte is simply latched in the eight bit data latch 70 for two cycles of the single clock signal. This can be accomplished by using a multiplexor on the data input of the eight bit data latch 70. The data output of the data latch 70 is fed back as one data input into the multiplexor. The other data input to the multiplexor is attached to the data output of the memory buffer 60. The data available control signal 64 from the memory buffer is coupled to the clock input of the multiplexor. The single clock signal connects to the clock input of both the eight bit data latch 70 and the single bit parity latch.

Figure 2B:
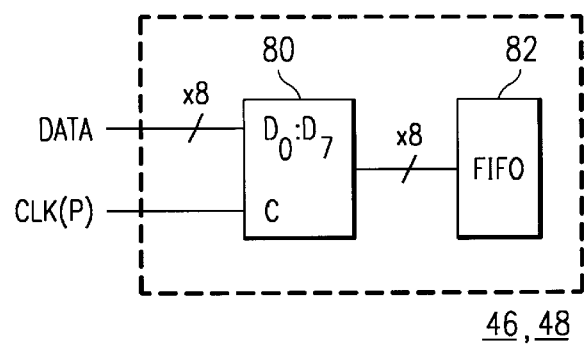
FIG. 2B is a block diagram of data transfer logic contained within the receiving device shown in the data transfer system of FIG. 1.

Referring to FIG. 2B, a block diagram is shown describing the data transfer logic 46, 48 at the receiving device 20. An eight bit memory latch 80 receives the data byte from the transceiver 42, 44 at its data inputs. The clock input to the eight bit data latch 80 connects to the parity bit location on the data bus 30, 32 as fed through the transceiver 42, 44. The data latch 80 also contains an eight bit output for transferring the transmitted data byte to a memory buffer 82 at the receiving device 40. In this configuration, the parity bit location within the data bus 30, 32 contains the clock signal to be used to synchronize and validate the data byte at the receiving device 40 as connects to the clock input of the data latch 80. The data latch 80 latches the data byte from its data inputs when the clock signal in the parity bit location of the data bus 30, 32 arrives at the clock input of the data latch 80. As stated earlier, the time skew between the data clock signal and the data byte should be greatly reduced at the receiving device 40 since the data clocking signal accompanies the data byte in the parity bit location of the data bus 30, 32.

Figure 3:
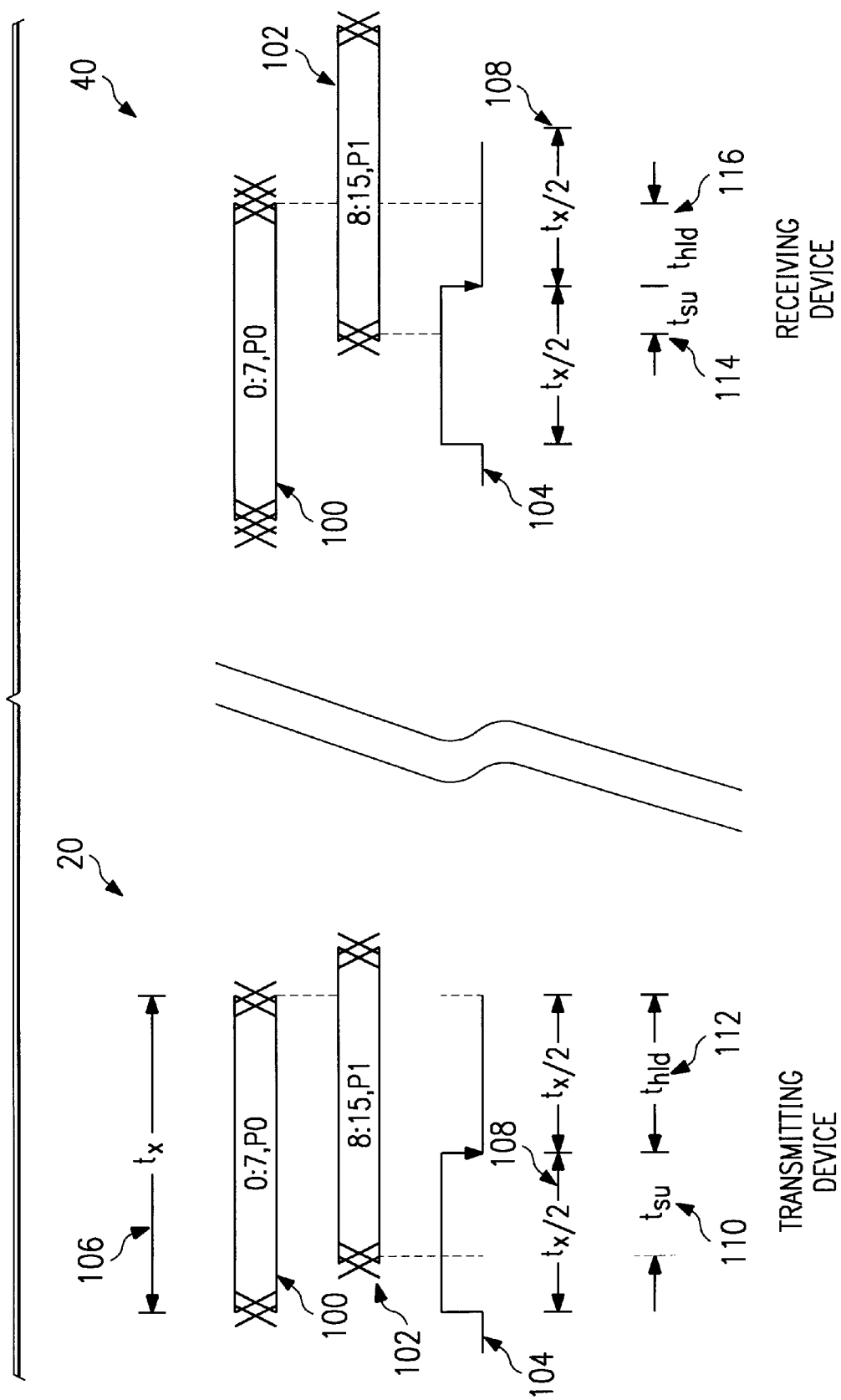
FIG. 3 is a timing diagram showing the time skew problems occurring in a typical prior art data transfer system.

The timing diagrams in FIG. 3 depict the time skew problem occurring in a typical data transfer system not using the parity bit location within the data bus to transfer the data clocking, or validation, signal. Two data bytes 100, 102 contain valid data values for a time period tx 106 at the transmitting device 20. A clocking signal 104 operates at a time interval tx/2 108, equal to one-half of the data interval 106. The falling edge of the clock signal 104 validates the data bytes 100, 102. Ideally, the triggering edge of the clock signal 104, in this case the falling edge, should align with a midpoint in the time interval where the data bytes 100, 102 contain valid values. Two time intervals, tsu 110 and thld 112, measure the minimum times in which the data values should be stable at the validating edge of the clock signal. A first time interval, tsu 110, indicates the minimum time prior to the latching edge of the clock signal 104 for valid data values. In turn, a second time interval, thld 112, indicates the minimum time after the latching edge of the clock signal 104 that the data values should be stable.

At the transmitting device 20, FIG. 3 shows two data bytes 100, 102 to be clocked by a single clock signal 104. In a case where no time skew exists, tsu 110 and thld 112 would both equal the clock interval, tx/2 108. However, data transfer systems using this typical data clocking technique often incur offsets between the time intervals 106 for valid data values in the two data bytes 100, 102. This offset, or time skew, reduces tsu 110 when the time for valid data 106 trails the clock signal 104. If the time interval for valid data 106 for either data byte 100, 102 precedes the clock signal 104, the time skew reduces thld 112. Thus, tsu 110 and thld 112 can both be reduced by a time skew when the time for valid data 106 for one data byte 100 precedes the clock signal 104 and the time interval for valid data 106 for the other data byte 102 trails the clock signal 104.

At the receiving device 40, FIG. 3 shows how the time skew can be amplified. Transmitting the data bytes 100, 102 and the clock signal 104 over separate data buses 30, 32 can often cause further shifting in the data bytes 100, 102 with respect to the clock signal 104. An added time shift further shortens tsu 110 and thld 112 at the receiving device 40. In this case, the first data byte 100 precedes the clock signal 104 and the second data byte 102 trails the clock signal 104. This time shift cause tsu 110 and thld 112 to be fractions of their ideal values, tx/2 108. In severe cases of time skewing, tsu 110 and/or thld 112 can reach zero. If tsu 110 reaches zero, the data transfer logic 46, 48 at the receiving device 40 can latch invalid, or indeterminate, data or the previous data byte in the data sequence, thereby storing a second copy of the data byte. Likewise, if thld reaches zero, the data transfer logic 46, 48 can latch invalid, or indeterminate, data or the next data byte in the data chain, thereby skipping the current data byte in the sequence.

Figure 4:
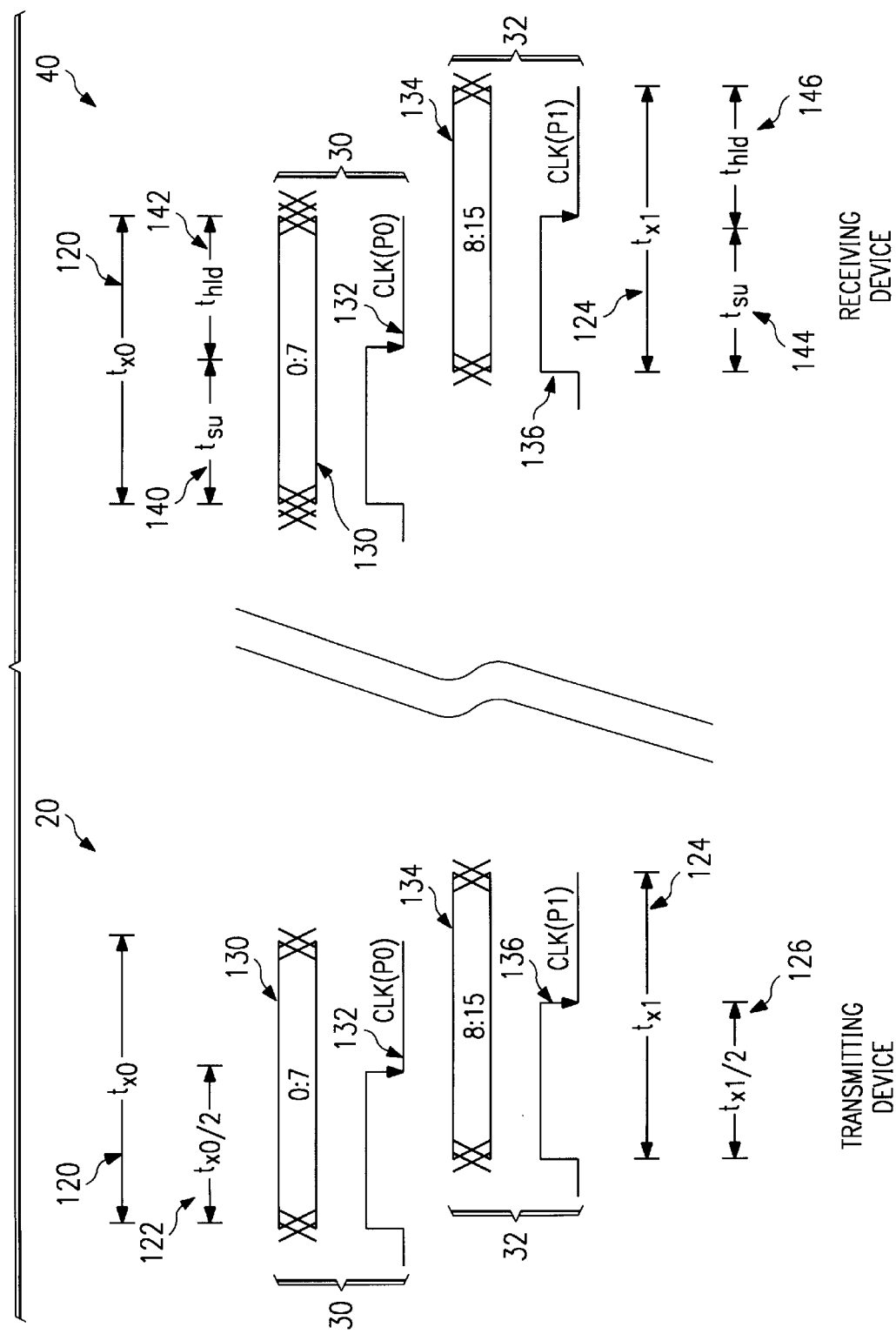
FIG. 4 is a timing diagram showing a minimal time skew associated with a data transfer system using various features embodied in the present invention.

The timing diagrams in FIG. 4 represent how the present invention improves the problem of time skew during data transmission between the transmitting 20 and receiving 40 devices. Separate time intervals, tx0 120 and tx1 124, for valid data are shown for each data byte 130, 134. Each data byte 130, 134 is transferred along a separate data bus 30, 32. In addition, a clock signal 132, 136 accompanies each data byte 130, 134 in the parity bit location within each data bus 30, 32. Again, the period of each clock signal, tx0/2 122 and tx1/2 126, equals one-half of the corresponding time interval of valid data 120, 124. The falling edge of each clock signal 132, 136 validates the data byte 130, 134 on the respective data bus 30, 32. The time skew, between the clock signal 132, 136 and the time intervals 120, 124 for valid data, is minimized at the transmitting device 20 since a separate clock signal 132, 136 accompanies the corresponding data byte 130, 134 in the parity bit location of the corresponding data bus 30, 32.

At the receiving device 40, the timing diagram represents how the time skew between the clock signal 132 and the data byte 130 is minimal, even though the time skew between the two data bytes 130 and 134 is substantial. Transmitting the data validation, or data clocking, signal using the parity bit location within each data bus 30, 32 minimizes the time shift between the data bytes 130, 134 and their corresponding clock signals 132, 136. Accordingly, the setup and hold times, tsu 140, 144 and thld 142, 146, for each clock signal 132, 136 approach the optimal value, equal to the clock period, tx0/2 122 and tx1/2 126. With little reduction in tsu 140, 144 and thld 142, 146, the potential for clocking invalid, or indeterminate, data or an incorrect data byte in the data sequence is practically eliminated.

Figure 5:
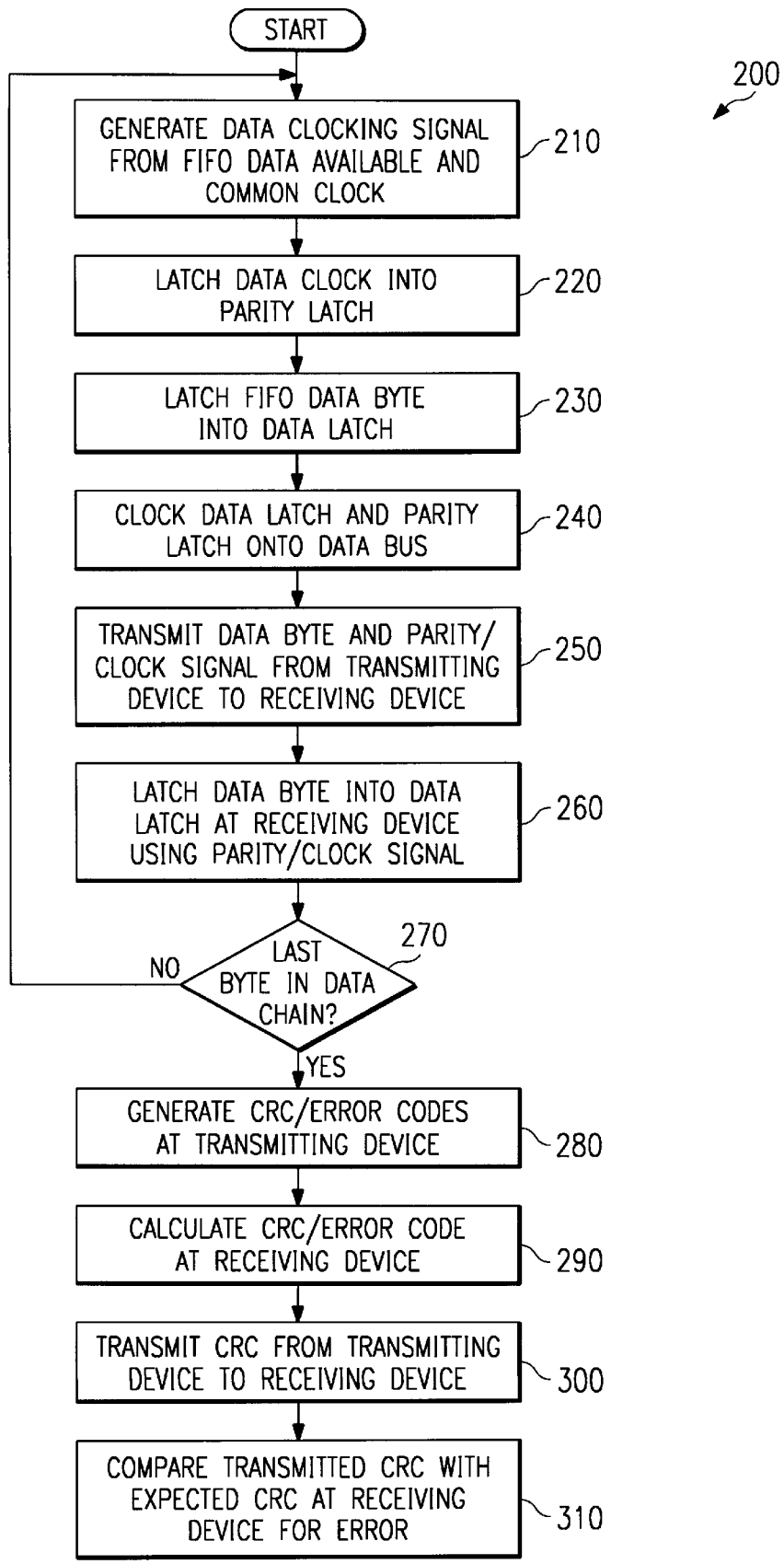
FIG. 5 is a flow diagram of a method for providing an improved clock signal for synchronizing and validating data in the data transfer system of FIG. 1.

Referring to FIG. 5, a flow diagram describes a method 200 for using a parity bit location within a data bus 30 to transmit a data clocking, or validation, signal from a transmitting device 20 to a receiving device 40. A step 210 generates a data clock signal at the transmitting device 20. from a data available signal 64 from a memory buffer 60. A converted common clock signal 54 latches the data clock into a single bit parity latch 72 at step 220. A step 230 latches a data byte from the memory buffer 60 into a data latch 70 using a second converted common clock signal 52. At step 240, the data byte and the data clock signal are loaded onto the data bus 30. The data latch 70 moves the data byte onto the data portion of the data bus at the same time the parity latch moves the data clock signal onto the parity bit location of the data bus. A step 250 transmits the clock signal and the data byte along the data bus 30 to the receiving device 40. At step 260, the receiving device 40 receives the data clock signal and the data byte and uses the data clock signal to validate the accompanying data byte and latch it into a data latch 80.

A step 270 determines whether all the data bytes in the data sequence have been transferred from the transmitting device 20 to the receiving device 40. If not, the method returns to step 210 to transfer another data byte in the data chain. Otherwise, a step 280 generates a cyclic redundancy check (CRC), or error code, at the transmitting device 20. A step 290 calculates an expected CRC, or error code, at the receiving device 40. A step 300 transfers the generated CRC as data bytes from the transmitting device 20 to the receiving device 40. A step 310 then compares the transmitted CRC with the expected CRC to determine whether an error has occurred during the transmission of the data chain between the transmitting 20 and receiving 40 devices.

While the invention has been particularly shown and described with reference to preferred embodiments thereof, it will be understood by those skilled in the art that various changes in form and details may be made therein without departing from the spirit and scope of the invention. For example, the present embodiment of the invention shows two data buses for concurrently transferring two bytes of data and two data clock signals in the corresponding parity bit locations. However, the invention could be used to concurrently transfer more than two data bytes, such as four data bytes along four data buses, each data bus containing a parity bit location for transmitting a data clock signal. This configuration effectively doubles the data transfer rate without increasing the frequency required from the data clock signal.

What is claimed is:

1. In a data transfer system having a transmitting device, a receiving device, and a data bus coupled between said transmitting device and said receiving device, a method for synchronizing data bit signals at said receiving device comprising steps of:

(a) generating a data clock signal at said transmitting device;

(b) concurrently latching said data clock signal into a parity bit location within said data bus and a set of data signals into a set of data bit locations within said data bus;

(c) transmitting said data signals and said data clock signal along said data bus; and (d) receiving said data signals at said receiving device by using said data clock signal in said parity bit location to latch said data signals from said data bit locations in said data bus.

2. The method in claim 1 further comprising:

(e) generating a set of error check signals, at said transmitting device, in accordance with said data signals previously transmitted from said transmitting device to said receiving device; and (f) transmitting said error check signals along said data bit locations of said data bus to said receiving device.

3. The method in claim 2 further comprising:

(g) determining a set of expected error check signals, at said receiving device, in accordance with said data signals previously received at said receiving device; and (h) comparing said expected error check signals with said error check signals to detect whether an error occurred in transmitting said data signals from said transmitting device to said receiving device.

4. In a data transfer system having a transmitting device, a receiving device, and a data bus coupled between said transmitting device and said receiving device, a data transmitter in said transmitting device comprising:

a memory buffer storing data and generating a data clock signal;

a data latch coupled to said memory buffer and further coupled to a set of data bit locations within said data bus;

a parity latch coupled to a parity bit location within said data bus; and a clock generator generating a clock signal, said clock generator coupled to said parity latch and further coupled to said data latch, said clock signal used to latch said data into said data latch and to further latch said data clock signal into said parity latch.

5. The data transmitter in claim 4 wherein said memory buffer further comprises data inputs, data outputs, a clock input, and a data clock output.

6. The data transmitter in claim 5 wherein said data latch further comprises data inputs, data outputs, and a clock input, said data inputs connected to said data outputs of said memory buffer, said data outputs connected to said data bit locations within said data bus.

7. The data transmitter in claim 6 wherein said parity latch further comprises a data input, a data output, and a clock input, said data input connected to said data clock output of said memory buffer, said data output connected to said parity bit location within said data bus.

8. The data transmitter in claim 7 wherein said clock generator further comprises a clock input and a clock output, said clock output connected to said clock input of said data latch and further connected to said clock input of said parity latch.

9. A data transfer system comprising:

a transmitting device to transmit data signals;

a receiving device to receive data signals; and a data bus coupled between said transmitting device and said receiving device, said data bus including data bit locations and a parity bit location, wherein said transmitting device generates a data clock signal and transmits said data clock signal with said data signals, said data signals transmitted in said data bit locations of said data bus, said data clock signal transmitted in said parity bit location of said data bus and used to latch said data signals at said receiving device.

10. The data transfer system in claim 9 wherein said transmitting device further comprises:

a transceiver coupled to said data bus, said transceiver adjusting a signal strength in said data signals and said data clock signal for transmission along said data bus to said receiving device; and a data transmitter coupled to said transceiver, said data transmitter generating said data signals and said data clock signal.

11. The data transfer system in claim 10 wherein said data transmitter further comprises:

a memory buffer storing data and generating a data clock signal;

a data latch coupled to said memory buffer and further coupled to said data bit locations within said data bus;

a parity latch coupled to said parity bit location within said data bus; and a clock generator generating a clock signal, said clock generator coupled to said parity latch and further coupled to said data latch, said clock signal used to latch said data into said data latch and to further latch said data clock signal into said parity latch.

12. The data transfer system in claim 9 wherein said receiving device further comprises:

a transceiver coupled to said data bus, said transceiver adjusting a signal strength in said data signals and said data clock signal for reception from said data bus; and a data receiver coupled to said transceiver, said data receiver using said data clock signal in said parity location within said data bus to latch said data signals from said data locations within said data bus.

13. The data transfer system in claim 12 wherein said data receiver further comprises:

a receiving data latch having data inputs and a clock input, said receiving data latch coupled to said data bus, said data inputs coupled to said data bit locations within said data bus, said clock input coupled to said parity bit location within said data bus.

14. The data transfer system in claim 9 wherein said transmitting device subsequently generates a set of error check signals when said data signals have been completely transferred to said receiving device, said transmitting device transmitting said error check signals along said data bus to said receiving device.

15. The data transfer system in claim 14 wherein said receiving device subsequently generates a set of expected error check signals when said data signals have been completely received at said receiving device, said receiving device then comparing said expected error check signals with said error check signals received from said transmitting device to determine if an error occurred during transmission of said data signals between said transmitting and receiving devices.

\* \* \* \* \*